(12) United States Patent
Omori

(10) Patent No.: US 6,982,470 B2
(45) Date of Patent: Jan. 3, 2006

(54) SEMICONDUCTOR DEVICE, METHOD OF MANUFACTURING THE SAME, COVER FOR SEMICONDUCTOR DEVICE, AND ELECTRONIC EQUIPMENT

(75) Inventor: Osamu Omori, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/722,365

(22) Filed: Nov. 25, 2003

(65) Prior Publication Data

US 2004/0159920 A1    Aug. 19, 2004

(30) Foreign Application Priority Data

Nov. 27, 2002  (JP)  ............................. 2002-343816

(51) Int. Cl.
*H01L 31/0203* (2006.01)
*H01L 27/15* (2006.01)

(52) U.S. Cl. .................. 257/434; 257/81; 257/98; 257/99; 257/432

(58) Field of Classification Search ................ 257/80, 257/81, 98–100, 432–434, 459, 466, 687–689, 257/704; 438/48, 64, 65, 125
See application file for complete search history.

(56) References Cited

U.S. PATENT DOCUMENTS

| 5,798,557 | A | * | 8/1998 | Salatino et al. | ............. 257/416 |
| 5,889,323 | A | * | 3/1999 | Tachibana | ................... 257/704 |
| 5,998,862 | A | * | 12/1999 | Yamanaka | ................... 257/704 |
| 6,594,153 | B1 | * | 7/2003 | Zu et al. | ...................... 361/792 |
| 6,727,431 | B2 | | 4/2004 | Hashimoto | ................. 174/52.2 |
| 2003/0122137 | A1 | | 7/2003 | Hashimoto | .................... 257/80 |
| 2003/0123779 | A1 | | 7/2003 | Hashimoto | .................... 385/14 |
| 2003/0124762 | A1 | | 7/2003 | Hashimoto | .................... 438/67 |

FOREIGN PATENT DOCUMENTS

JP    5-110960    4/1993

* cited by examiner

*Primary Examiner*—Hung Vu
(74) *Attorney, Agent, or Firm*—Hogan & Hartson, LLP

(57) ABSTRACT

A method of manufacturing a semiconductor device includes (a) fixing a cover onto a semiconductor substrate so as to place a surface of the cover that includes a portion defining a first opening, face to face on a surface of the semiconductor substrate that includes an electrode and (b) applying an adhesive to the inside of the first opening.

4 Claims, 8 Drawing Sheets

SEMICONDUCTOR DEVICE, METHOD OF MANUFACTURING THE SAME, COVER FOR SEMICONDUCTOR DEVICE, AND ELECTRONIC EQUIPMENT

BACKGROUND OF THE INVENTION

1. Field of the Invention

The present invention relates to a semiconductor device, a method of manufacturing the same, a cover for a semiconductor device and electronic equipment.

2. Description of Related Art

It is well known that an optical chip that includes an optical unit such as a light receiver should be sealed with a cover on the surface thereof having the optical unit. In sealing the optical chip, a space is left between the optical unit and the cover. When manufacturing a plurality of optical chips by dicing a substrate such as a wafer, substrate shavings resulting from dicing or other wastes may be attached to the optical unit and sealed together without removing the wastes like shavings. It is also noted that the cover should be mounted horizontally to the optical unit, since the cover fixed in a tilted position on the optical unit may result in distortion of an optical axis.

The present invention aims to enhance the reliability of products having a semiconductor device.

SUMMARY OF THE INVENTION

A method of manufacturing a semiconductor device according to the present invention includes the following processes: (a) fixing a cover onto a semiconductor substrate so as to place a surface of the cover that includes a portion defining a first opening face to face on a surface of the semiconductor substrate that includes an electrode; and (b) applying an adhesive to the inside of the first opening. According to the method of the present invention, the adhesive is applied to the first opening of the cover so as to fix the cover onto the semiconductor substrate. This makes it possible to eliminate the thickness of the adhesive between the cover and the semiconductor substrate, since the adhesive stays inside the first opening. At the same time, if the adhesive is applied to the cover being fixed to the semiconductor substrate, the cover can be placed horizontal to the semiconductor substrate with a high degree of precision.

The cover may include a translucent portion in at least part thereof, and the semiconductor substrate may include an optical unit. Process (a) may also include a process of fixing the cover onto the semiconductor substrate, so as to provide the first opening of the cover on a portion of the semiconductor substrate other than the optical unit, and to provide the translucent portion on the optical unit. In processes (a) and (b), the optical unit may be sealed.

According to the method of manufacturing a semiconductor device, the surface of the cover that includes the portion defining the first opening may also include a portion defining a second opening. Process (a) may also include a process of fixing the cover onto the semiconductor substrate so as to provide the optical unit in the second opening.

The first opening may be provided so as to surround the second opening. Since the first opening surrounds the second opening, the cover and the semiconductor substrate can be tightly fixed.

The semiconductor substrate may also include an electrode on a surface thereof, and the surface of the cover that includes the portion defining the first opening may also include a portion defining a third opening. Process (b) may also include a process of fixing the cover onto the semiconductor substrate so as to provide the electrode in the third opening.

According to the method of manufacturing a semiconductor device, the third opening may be provided so as to surround the first opening and the second opening.

According to the method of manufacturing a semiconductor device, the cover may also include a portion defining a through-hole that extends from a back side of the surface that includes the portion defining the first opening to inside the first opening. Process (c) may also include a process of applying the adhesive from the through-hole so as to provide the adhesive to the first opening.

The portion defining the first opening may include a portion that is formed in line along the cover, and the portion defining the through-hole may include a slit that is formed in line on the portion of the first opening that is formed in line.

The first opening may be formed so as to penetrate from one side of the cover to the other side of the cover. Process (c) may also include a process of applying the adhesive to the first opening from any one of the sides of the cover. Thus, the adhesive is provided due to a capillary action.

According to the method of manufacturing a semiconductor device, the semiconductor substrate may also include a plurality of portions that are each to be an optical chip that includes the optical unit. The method may also include the following process: (d) dividing the semiconductor substrate so as to manufacture the optical chip that includes the optical unit. This can avoid wastes from attaching to the optical unit, since the cutting process is conducted after bonding the cover with the semiconductor substrate to each other. This enhances the reliability of products having a semiconductor device.

Process (d) may also include a process of also dividing the cover and removing a portion of the cover that faces the electrode.

A semiconductor device according to the invention is manufactured by any one of the above-mentioned methods. The semiconductor device may also include a support member attached thereto. The semiconductor device may also include a circuit substrate that is electrically coupled to the electrode of the semiconductor device. Electronic equipment according to the invention includes the semiconductor device.

A cover for a semiconductor device according to the invention seals the optical unit of the semiconductor substrate that includes the optical unit. The cover for a semiconductor device includes a portion defining a first opening and a portion defining a second opening on a surface thereof. The first opening is formed along a circumference of the second opening, while the second opening is formed so as to include the optical unit. The cover for a semiconductor device also includes a translucent portion in at least the portion defining the second opening. According to the invention, the adhesive is applied to the first opening of the cover, and thereby the cover and the semiconductor substrate can be bonded to each other. If the adhesive stays inside the first opening, it is possible to eliminate the thickness of the adhesive between the cover and the semiconductor substrate. At the same time, if the adhesive is applied to the cover being fixed to the semiconductor substrate, the cover can be horizontal to the semiconductor substrate with a high degree of precision.

Regarding the cover for a semiconductor device, the first opening may be formed so as to surround the second opening. Since the first opening surrounds the second opening, the cover and the semiconductor substrate can be tightly fixed.

The cover for a semiconductor device may also include a portion defining a third opening on the surface that includes the portion defining the first opening and the portion defining the second opening. The third opening may be formed along a circumference of the second opening.

Regarding the cover for a semiconductor device, the first opening may be formed between the second opening and the third opening.

The cover for a semiconductor device may also include a portion defining a through-hole that extends from a back side of the surface that includes the portion defining the first opening to inside the first opening.

Regarding the cover for a semiconductor device, the portion defining the first opening may include a portion that is formed in line along the cover, and the portion defining the through-hole may include a slit that is formed in line on the portion of the first opening that is formed in line.

Regarding the cover for a semiconductor device, the first opening may be formed so as to penetrate from one side of the cover to the other side of the cover.

DETAILED DESCRIPTION OF THE PREFERRED EMBODIMENTS

Embodiments of the invention are described below with reference to the accompanying drawings.

(First Embodiment)

Figure 1:
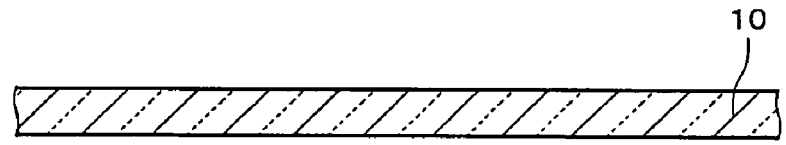
FIGS. 1(A) to (C) illustrate a method of manufacturing a semiconductor device according to a first embodiment of the present invention.
Figure 1:
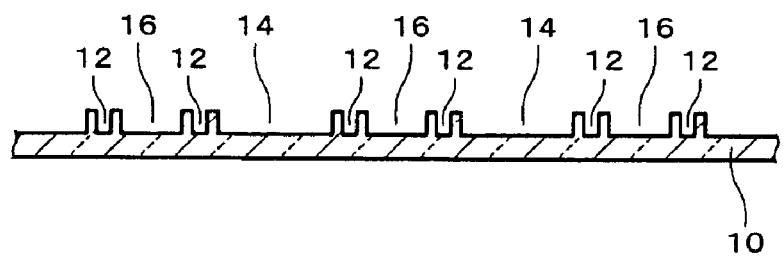
Figure 1:
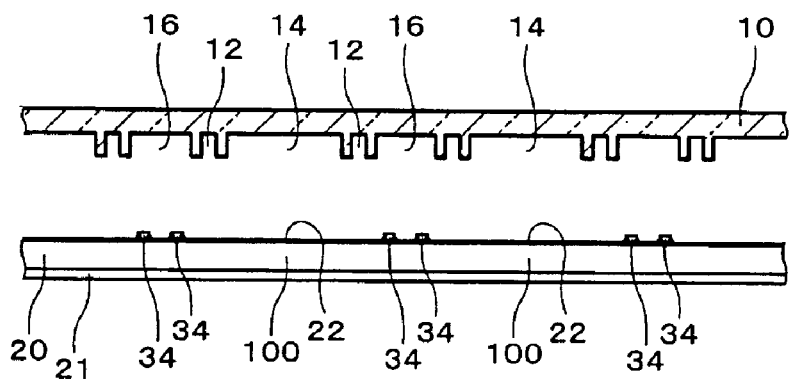
Figure 2:
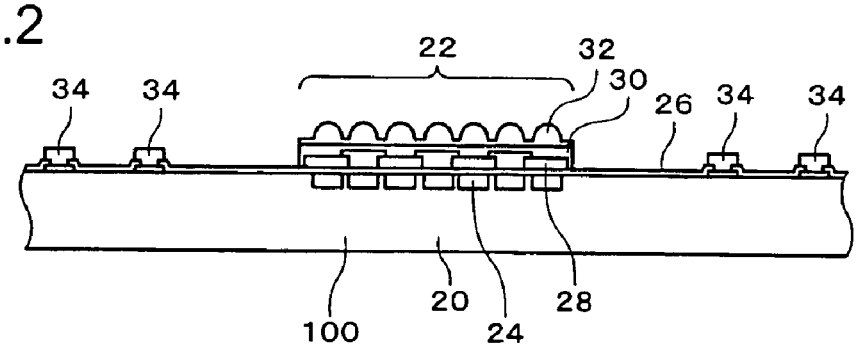
FIG. 2 illustrates a method of manufacturing a semiconductor device according to the first embodiment of the present invention.
Figure 3:
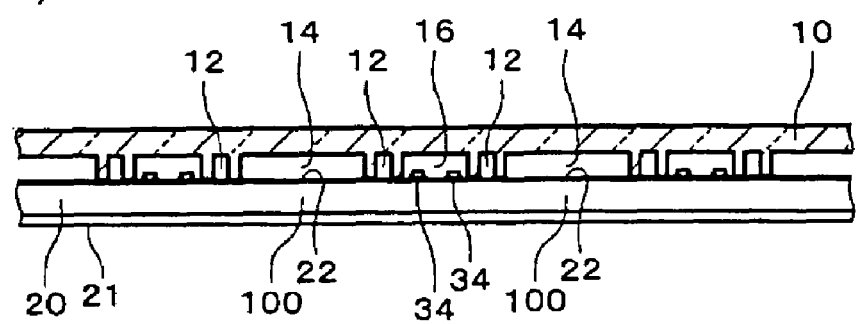
FIGS. 3(A) and (B) illustrate a method of manufacturing a semiconductor device according to the first embodiment of the present invention.
Figure 3:
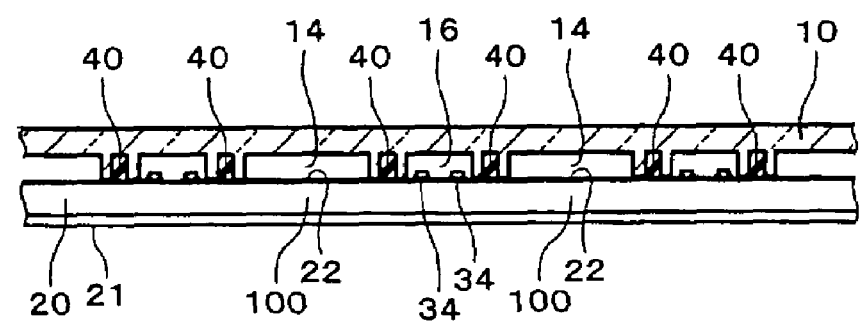
Figure 4:
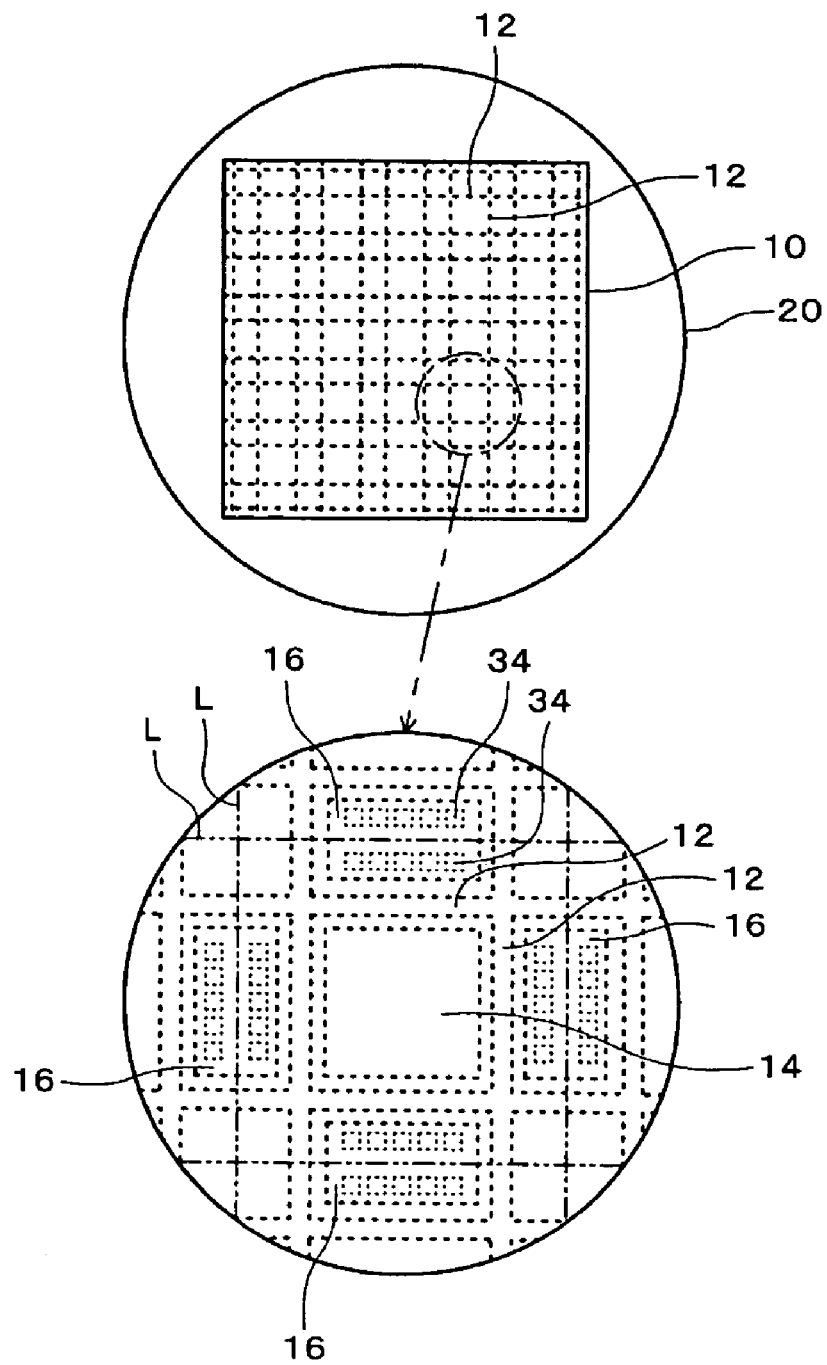
FIG. 4 illustrates a method of manufacturing a semiconductor device according to the first embodiment of the present invention.
Figure 5:
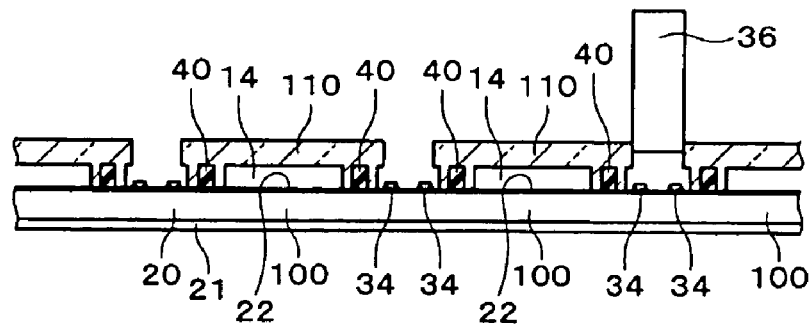
FIGS. 5(A) and (B) illustrate a method of manufacturing a semiconductor device according to the first embodiment of the present invention.
Figure 5:
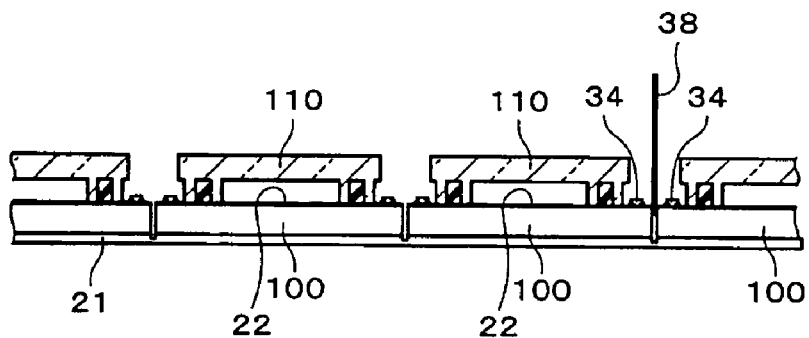

FIGS. 1(A) to 6 illustrate a semiconductor device and the method of manufacturing the same according to a first embodiment of the present invention. In this embodiment, an optical device and the method of manufacturing the same are cited as an example. In this method of manufacturing, a cover 10 and a semiconductor substrate 20 are bonded with an adhesive 40. FIG. 4 is a plan view of the cover 10 and the semiconductor substrate 20 facing each other. The semiconductor substrate 20 includes at least one portion (for example, a plurality of such portions) to be an optical chip 100 having an optical unit 22. The semiconductor substrate 20 also includes electrodes 34.

FIG. 1(A) shows the cover 10 (a cover for a semiconductor device) used in this embodiment. The cover 10 may be a substrate. The size and the shape of the cover 10 are not limited; it may be as large as the semiconductor substrate 20, and it may be the same shape as the semiconductor substrate 20. As FIG. 4 shows, the cover 10 may be a quadrangle smaller than the semiconductor substrate 20. The cover 10 includes a translucent portion, which has at least light transmitting properties. The translucent portion may cover either part or all of the cover 10. The cover 10 may be made of optical glass. If only the translucent portion passes light, it does not matter how large the scale of loss may be that it entails. The translucent portion may only pass light with a specific wavelength. For example, the translucent portion may be transparent to visible light, but not to light in the infrared region. For another example, the translucent portion may have a small optical loss to invisible light, and a large loss to light in the infrared region. Moreover, an optical functional film such as an antireflection film and an infrared-ray shielding film may be formed on the surface of the translucent portion. This makes it possible to miniaturize the optical device without the need for including another device having this optical function.

As FIG. 1(B) shows, the cover 10 includes a portion defining a first opening 12. The first opening 12 is formed on a side of the cover 10 in order to provide an opening for an adhesive 40. The shape inside the first opening 12 may be either a flat surface or a curved surface. The first opening 12 may taper towards either end. This means, for example, the top area of the first opening 12 may be larger than its bottom area. The first opening 12 may be formed by cutting the cover 10 mechanically. In other words, the first opening 12 may be formed by removing and half-cutting part of the surface of the cover 10 in the direction of the height of the cover 10 with a blade. More specifically, the first opening 12 may be formed with a dicing blade (not shown in the drawing) that is used in a process of dicing a semiconductor device. Alternatively, the first opening 12 may be formed with an etching process or exposure to a laser beam. The size and the shape of the first opening 12 is not limited, if only it provides an opening for the adhesive 40.

The first opening 12 may be a trench. As shown in FIG. 4, a plurality of trenches as the first opening 12 may be laid out in a lattice structure. In this drawing, a plurality of trenches intersects each other and form spaces with a certain pattern. This makes it possible to fill all of the trenches with the adhesive 40 from any of the trenches, which can simplify the manufacturing processes.

In the example illustrated in FIG. 4, the first opening 12 penetrates the cover 10 from its one surface to the other surface. In other words, the first opening 12 is formed from one side of the cover 10 through the other. Specifically, a plurality of trenches (the first opening 12) extends to any side of the cover 10.

As FIG. 1(B) shows, the cover 10 includes a portion defining a second opening 14. The second opening 14 is formed on the surface of the cover 10 where the first opening 12 is formed. The second opening 14 may be an opening for accommodating the optical unit 22. The second opening 14 is large enough to surround the optical unit 22. This means the concave region of the second opening 14 is larger than the optical unit 22. Specifically, the second opening 14 surrounds the optical unit 22 such that each corresponds to the optical chip 100. The second opening 14 may be a quadrangle. The second opening 14 provided on the cover 10 may include a plurality of second openings. The second opening 14 can be formed in the same manner as the first opening 12. If the cover 10 includes a translucent portion, this means that the cover 10 includes a translucent portion at least in the second opening 14.

As FIG. 1(B) shows, the cover 10 also includes a portion defining a third opening 16. The third opening 16 is formed on the surface of the cover 10 where the first opening 12 and the second opening 14 are formed. The third opening 16 may be an opening for accommodating the electrodes 34. The third opening 16 surrounds the electrodes 34. This means the third opening 16 is provided so as to surround at least one of the electrodes 34 (for example, two electrodes or more) on the semiconductor substrate 20. As shown in FIG. 4, the third opening 16 may surround at least one of the electrodes 34 (a plurality of electrodes shown in FIG. 4) of adjacent optical chips (referred to as the optical chip 100). To put it differently, the third opening 16 may be arrayed along a cut line L shown in FIG. 4. In this case, the third opening 16 may be formed on both sides of the cut line L. Furthermore, the third opening 16 may be formed around the second opening 14. The third opening 16 provided on the cover 10 may include a plurality of third openings. The third opening 16 can be formed in the same manner as the first opening 12.

As FIG. 4 shows, the first opening 12 (e.g. a trench) may surround the second opening 14. In other words, the first opening 12 may be arranged in a frame structure surrounding the second opening 14. In the example illustrated in FIG. 4, a plurality of trenches is laid out in a lattice structure, and the second opening 14 is formed in any one of the divided areas located within the lattice structure. The first opening 12 is formed between the second opening 14 and the third opening 16. The first, second, and third openings 12, 14, and 16, respectively, are formed so as to each provide an opening on the same side facing the semiconductor substrate 20.

FIG. 1(C) shows the semiconductor substrate 20 used in this embodiment. To facilitate a latter cutting process which is described below in greater detail, a sheet 21 may be attached to the semiconductor substrate 20. FIG. 2 is an enlarged view of part of the semiconductor substrate 20. The semiconductor substrate 20 includes a portion that is to be the optical chip 100 here including a plurality of optical chips having the optical unit 22. The optical chip 100 includes the optical unit 22 and the electrodes 34. The optical unit 22 includes a light receiving portion or a light emitting portion (a light receiver or a light emitter), which converts optical energy to other forms of energy (e.g. electrical energy) or vice versa. A single optical unit 22 may include a plurality of energy converting parts 24 (light receivers and/or light emitters).

In this embodiment, a solid-state imaging device (for example, a CCD, in particular, a CCD including a photodiode, and an image sensor such as a CMOS sensor) is cited as an example. Here, the optical unit 22 includes the energy converting parts 24 (light receivers or image sensing portions). As shown in FIG. 2, the energy converting parts 24 are laid out in a two dimensional space for sensing images. The energy converting parts 24 may be covered by a passivation film 26 that has light transmitting properties. If the semiconductor substrate 20 includes a semiconductor substrate (e.g. a semiconductor wafer), the passivation film 26 may be made of a silicon dioxide ($SiO_2$) film and a silicon nitride ($Si_3N_4$) film.

The optical unit 22 may include a colored filter 28. The colored filter 28 may be formed on the passivation film 26. On the colored filter 28, a planarizing layer 30 may be formed. Moreover, a micro lens array 32 may be formed on the surface of the optical unit 22. This makes the second opening 14 on the cover 10 cover at least an area where the micro lens array 32 is provided on the semiconductor substrate 20.

A plurality of the electrodes 34 is formed on the semiconductor substrate 20. The electrodes 34 may be electrically coupled to the optical unit 22. Although the electrodes 34 shown in FIG. 2 include a bump formed on a pad, the bump is omissible. As FIG. 2 shows, the electrodes 34 are preferably formed outside the optical unit 22 on the optical chip 100. For example, the electrodes 34 may be provided between adjacent optical units (referred to as the optical unit 22). Here, a group of the electrodes 34 (a plurality of electrodes) is provided to each optical unit 22. For example, as shown in FIG. 4, the electrodes 34 may be arrayed along multiple sides (along four sides, for example) of the optical unit 22. Alternatively, the electrodes 34 may be arrayed along facing two sides of the optical unit 22.

As FIG. 1(C) shows, the cover 10 is placed face to face on the semiconductor substrate 20. More specifically, the surface of the cover 10 on which the first, second, and third openings 12, 14, and 16, respectively, are formed, is placed face to face on the surface of the semiconductor substrate 20 on which the optical unit 22 is formed.

As shown in FIG. 3(A), the cover 10 is mounted on the semiconductor substrate 20 so as to cover the first, second, and third openings 12, 14, and 16, respectively. Here, the cover 10 is temporarily placed face to face on the semiconductor substrate 20, for example, by sandwiching them with applied pressure. Parts of the cover 10 except for the first, second, and third openings 12, 14, and 16, respectively, come in contact with the semiconductor substrate 20. Since no adhesive is applied to the points of contact, the cover 10 can be planarized with the semiconductor substrate 20 with a high degree of precision. Before this process, it is preferable that the cover 10 and the semiconductor substrate 20 are washed and dried. This cleans the optical unit 22, and thereby improves the process yield.

Thus, the first opening 12 and the semiconductor substrate 20 form a first space, the second opening 14 and the semiconductor substrate 20 form a second space, and the third opening 16 and the semiconductor substrate 20 form a third space. The first space is formed above a region except the optical unit 22 of the semiconductor substrate 20. The second space is formed above the optical unit 22. In the third space, the electrodes 34 may be formed. In other words, the first opening 12 is disposed above the region except the optical unit 22 of the semiconductor substrate 20, the second opening 14 above the optical unit 22, and the third opening 16 is disposed above the electrodes 34. If the second opening 14 includes a translucent portion, this means that a translucent portion is disposed on the optical unit 22.

Subsequently, the adhesive 40 is applied to the inside of the first opening 12 (the first space) as shown in FIG. 3 (B). In this embodiment, as FIG. 4 shows, the adhesive 40 is applied to the inside of the first opening 12 from the sides of the cover 10. The adhesive 40 is injected with a tool. The adhesive 40 may be injected by moving the tool along at least one side of the quadrangle of the cover 10, or at a fixed point on the circumference of the cover 10. In either case, the adhesive 40 spreads through all trenches due to a capillary action. Preferably the first opening 12 is wholly filled with the adhesive 40. In this case, the outside of the concave region of the first opening 12 is in contact with the semiconductor substrate 20. The adhesive 40 does not exist between the semiconductor substrate 20 and the region except the concave region of the first opening 12.

The adhesive force of the adhesive 40 is obtained by applying energy such as heat or light. The adhesive 40 may be a thermosetting resin or an ultraviolet curing resin. Thus the cover 10 and the semiconductor substrate 20 are bonded to each other. If the optical unit 22 is disposed in the second opening 14 (the second space), the optical unit 22 is thus sealed. More specifically, the optical unit 22 is sealed so as to leave a space between the cover 10 and the semiconductor substrate 20. Here, air pressure in the space may be reduced, the air may be evacuated, or the space may be filled with nitrogen or dry air. For example, the above-mentioned structure is available as a result of the sealing process under pressure below atmospheric pressure, under vacuum, or under the atmosphere of nitrogen or dry air. This makes it possible to reduce water vapors in the space and to avoid dew condensation as well as a burst as a result of inner pressure increased by heating. When the first opening 12 surrounds the second opening 14, the cover 10 and the semiconductor substrate 20 can be tightly bonded and fixed.

As shown in FIG. 5(A), the cover 10 is cut and divided into a plurality of covers, which is hereinafter referred to as a cover 110. Cutting may be restricted to areas other than the translucent portion of the cover 10. This means that the cover 10 is cut in a way not to cut the second opening 14. Also, cutting may be restricted to areas other than the first opening 12, to which the adhesive 40 is applied, in the cover 10. The cover 10 may be cut along areas overlapping with the cut line L (see FIG. 4) of the semiconductor substrate 20 as described later. In the example illustrated in FIG. 5(A), the cover 10 is cut so as to remove parts where it meets the electrodes 34 (part of the third opening 16). This facilitates an electrical coupling to the electrodes 34. Specifically, the cover 10 is cut with a first cutter 36 (e.g. a dicing blade). If a cut line (e.g. a trench) is specified on the cover 10 in advance, it can be cut accurately.

As shown in FIG. 5(B), the semiconductor substrate 20 is cut and divided into optical chips 100. The semiconductor substrate 20 is cut along the cut line L shown in FIG. 4. The semiconductor substrate 20 may be cut with a second cutter 38 (e.g. a dicing blade). The blade width of the second cutter 38 is preferably narrower than that of the first cutter 36. The semiconductor substrate 20 is cut at a point that is outside the optical unit 22 and further outside the electrodes 34. In the example illustrated in FIG. 5(B), the semiconductor substrate 20 is cut between the electrodes 34 provided between adjacent optical units (referred to as the optical unit 22). If the sheet 21 is attached to the semiconductor substrate 20, the semiconductor substrate 20 is not completely cut into each of the optical chips 100. Thus a plurality of semiconductor devices 1 (optical devices) is manufactured. This can avoid wastes from attaching to the optical unit 22, since the cutting process is conducted after the cover 10 and the semiconductor substrate 20 are bonded to each other. This enhances the reliability of products having a semiconductor device.

According to the method of manufacturing a semiconductor device of the present embodiment, the adhesive 40 is applied to the inside of the first opening 12 of the cover 10 so as to bond the cover 10 and the semiconductor substrate 20 to each other. This makes it possible to eliminate the thickness of the adhesive 40 between the cover 10 and the semiconductor substrate 20, since the adhesive 40 stays inside the first opening 12. At the same time, if the adhesive 40 is disposed under the state when the cover 10 is fixed to the semiconductor substrate 20, the cover 10 can be planarized with the semiconductor substrate 20 with a high degree of precision. Therefore, the height and leveling of the cover 10 can be precisely adjusted. Consequently, it is possible to prevent an optical axis from being distorted and to manufacture highly reliable products having a semiconductor device.

As one modification, the optical unit 22 may be sealed by the adhesive 40 applied to the inside of the first opening 12. In this case, the adhesive 40 has light transmitting properties. This makes it possible for the first opening 12 to bond both the cover 10 and the semiconductor substrate 20 and seal the optical unit 22. Therefore, the second opening 14 can be eliminated, and thereby the structure of the cover 10 is simplified.

As another modification, the adhesive 40 may be applied to either the cover 10 or the semiconductor substrate 20 before bonding them to each other. In this case, the adhesive 40 should remain inside the concave region of the first opening 12. Also, the adhesive force of the adhesive 40 applied to the first opening 12 may be obtained, under the state when the cover 10 and the semiconductor substrate 20 are bonded to each other.

Figure 6:
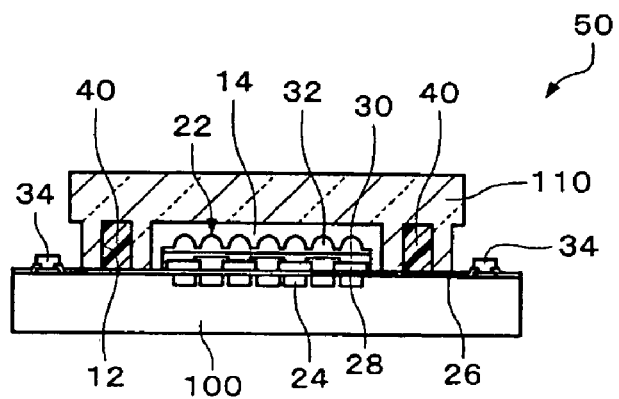
FIG. 6 illustrates a method of manufacturing a semiconductor device according to the first embodiment of the present invention.

FIG. 6 is a diagram illustrating a semiconductor device according to the present embodiment. An optical device is cited as an example in this embodiment. An optical device 50 includes the cover 110, on which the first opening 12 is formed, the optical chip 100, and the adhesive 40 that is applied to the first opening 12. The cover 110 includes a translucent portion and passes light. The adhesive 40 that fixes the cover 110 onto the optical chip 100 is applied to the first opening 12 on the cover 110. The adhesive 40 may be applied to inside the cover 110 as shown in FIG. 6, or may run off the edge of the cover 110. A semiconductor device according to this embodiment includes the structure obtained by any of the manufacturing methods mentioned above and produces the advantages mentioned above. Moreover, it should be understood that methods of manufacturing a semiconductor device according to this embodiment are not limited to the above-mentioned examples.

(Second Embodiment)

Figure 7:
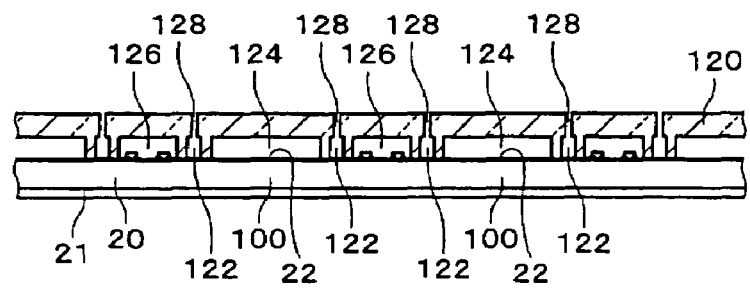
FIGS. 7(A) and (B) illustrate a method of manufacturing a semiconductor device according to a second embodiment of the present invention.
Figure 7:
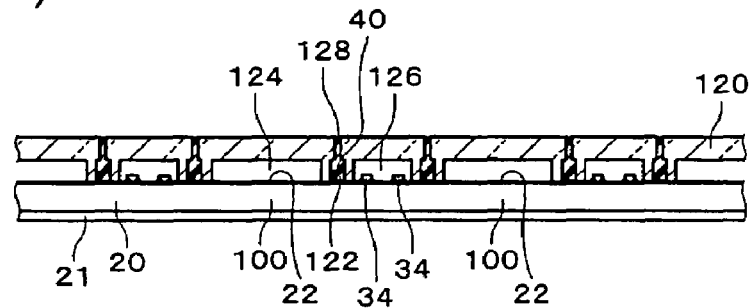
Figure 8:
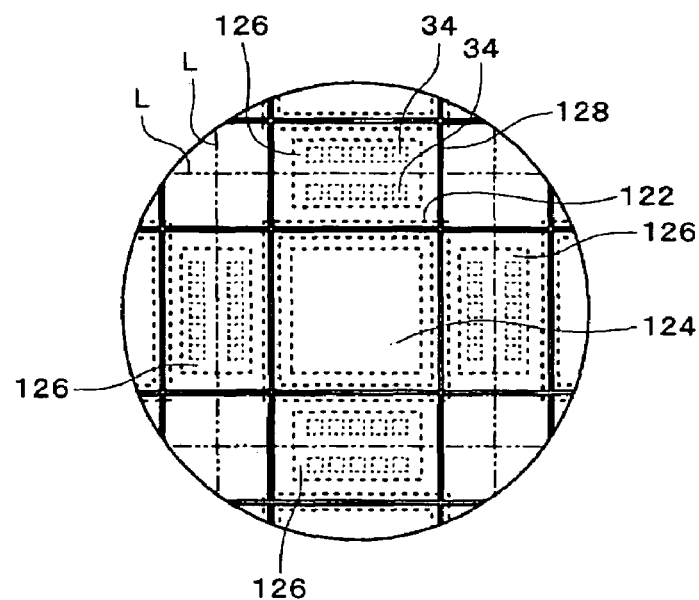
FIG. 8 illustrates a method of manufacturing a semiconductor device according to the second embodiment of the present invention.

FIGS. 7(A) to 8 illustrate a method of manufacturing a semiconductor device (e.g. an optical device) according to a second embodiment of the present invention. FIG. 8 is a plan view of a cover 120 and the semiconductor substrate 20 facing each other.

In this embodiment, as FIG. 7(A) shows, the cover 120 includes a portion defining a through-hole 128 that penetrates inside a first opening 122. To put it differently, the cover 120 has the through-hole 128 that extends from the back side of the cover 120, on which the first opening 122 is provided, to the inside of the first opening 122. The through-hole 128 penetrates the cover 120 in the direction of the height of the cover 120. The width of the through-hole 128 may be narrower than that of the first opening 122. The through-hole 128 may be a slit extending to an area overlapping with the first opening 122. For example, as shown in FIG. 8, the first opening 122 here including a plurality of first openings may be arranged so as to surround a second opening 124 in a frame structure, and a plurality of slits may be formed in a lattice structure so as to include an area along the frame of the first opening 122. This means that a trench that is the first opening 122 overlaps with a slit that is the through-hole 128. In other words, the slit as the through-hole 128 extends in line along the trench as the first opening 122, at least part of which is provided in line. In this case, the through-hole 128 provided on the first opening 122 is arranged in parallel with the trench as the first opening 122. A plurality of slits may intersect each other so as to form a consecutive trench. Thus, even if the first opening 122 includes a plurality of individual spaces on the cover 120, the adhesive 40 reaches the first opening 122 here including a plurality of first openings by injecting the adhesive 40 from any of the slits, which can simplify the manufacturing processes. The adhesive 40 reaches all of the first openings 122 that is linked to each other.

As shown in FIG. 7(A), the cover 120 and the semiconductor substrate 20 are fixed so as to shield the first opening 122, the second opening 124, and a third opening 126. Then the adhesive 40 is applied to the inside of the first opening 122 as shown in FIG. 7(B). In this embodiment, the adhesive 40 is provided through the through-hole 128 above the first opening 122. The adhesive 40 may be injected by moving a tool for injection along the slits, or at a fixed point of the slits.

Other details of this embodiment are the same as those of the first embodiment. This embodiment also produces the advantages mentioned in the description of the first embodiment.

(Other Embodiments)

Figure 9:
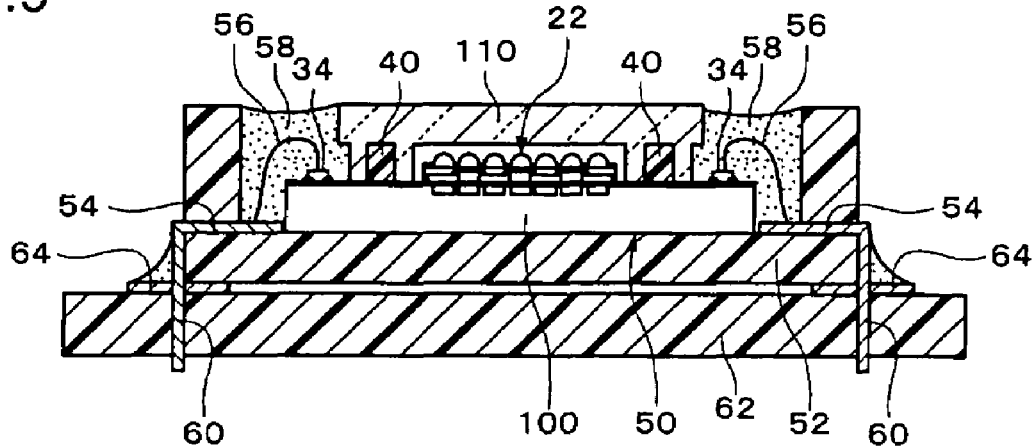
FIG. 9 is a diagram illustrating a semiconductor device according to an embodiment of the present invention.

FIG. 9 is a diagram illustrating a semiconductor device (e.g. an optical module) and a circuit substrate according to an embodiment of the invention. The optical module includes the optical device 50 shown in FIG. 6. The optical device 50 is attached to a support member 52 (e.g. a case). The support member 52 may include a wiring 54 but not necessarily. The support member 52 may be a molded interconnect device (MID). The wiring 54 is electrically coupled to the electrodes 34 of the optical device 50. At an electrically coupling point (for example, a point on the wiring 56 and its bonded portion) a sealing material 58 is provided. In other words, the electrically coupling point is sealed with the sealing material 58. The sealing material 58 may be a potting material. The sealing material 58 does not cover the optical unit 22, since the optical unit 22 is sealed with the cover 110 in the optical device 50. This is because the cover 110 acts as a dam to block the sealing material 58.

Part of the wiring 54 is an external terminal 60 (e.g. a lead wire). The external terminal 60 is electrically coupled to a wiring pattern 64 that is formed on a circuit substrate 62. In the example illustrated in FIG. 9, the circuit substrate 62 has a portion defining a hole in which the external wiring 60 is inserted. A land of the wiring pattern 64 is formed around the hole. The land and the external wiring 60 are fixed with a brazing filler metal (e.g. solder). Thus the optical module is mounted on the circuit substrate 62.

Figure 10:
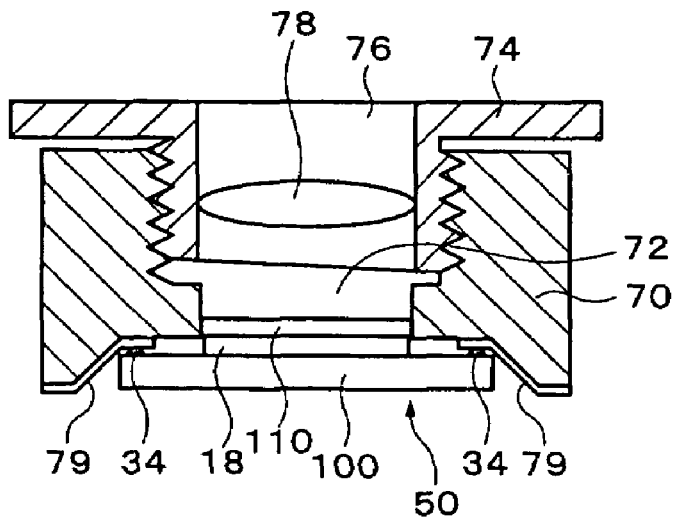
FIG. 10 is a diagram illustrating a semiconductor device according to an embodiment of the present invention.

FIG. 10 is a diagram illustrating a semiconductor device (e.g. an optical module) according to an embodiment of the invention. The optical module shown in this diagram includes the optical device 50 shown in FIG. 6 and a support member 70 attached thereto. The support member 70 includes a portion defining a hole 72. At least part of the cover 110 stays in the hole 72. In the hole 72, a lens holder 74 is fitted. The lens holder 74 also includes a portion defining a hole 76 in which a lens 78 is held. The hole 76 passes through the hole 72, and a light condensed by the lens 78 enters the optical device 50. The cover 110 may block out light in the infrared region. To couple the electrodes 34 of the optical device 50 and a wiring 79 of the support member 70, any adhesive agent, anisotropic conductive material, anisotropic conductive film, of metal material can be used. Furthermore, an under-fill material not shown in the diagram may be provided between the optical device 50 and the support member 70.

Figure 11:
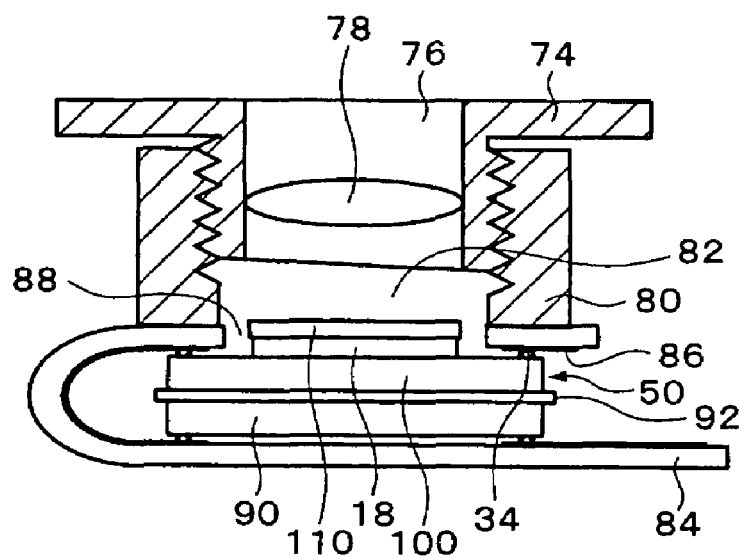
FIG. 11 is a diagram illustrating a semiconductor device according to an embodiment of the present invention.

FIG. 11 is a diagram illustrating a semiconductor device (e.g. an optical device) according to an embodiment of the present invention. The optical module shown in this diagram includes the optical device 50 shown in FIG. 6 and a support member 80 attached thereto. The support member 80 includes a portion defining a hole 82. At least part of the cover 110 stays in the hole 82. In the hole 82, a lens holder 74 is fitted (as described in detail above).

The optical device 50 shown in FIG. 11 is mounted on a substrate 84. A wiring pattern 86 formed on the substrate 84 is coupled to the electrodes 34. For coupling them, an adhesive agent, anisotropic conductive material, anisotropic conductive film, or metal material can be used. Furthermore, an under-fill material not shown in the diagram may be provided between the optical device 50 and the substrate 84. The substrate 84 also includes a portion defining a hole 88. The hole 76 passes through the holes 82 and 88, and a light condensed by the lens 78 enters the optical device 50.

An electronic unit 90 (e.g. a semiconductor chip) is mounted (e.g. by face-down bonding) on the substrate 84. The electronic unit 90 is electrically coupled to the wiring pattern 86. A plurality of other electronic units not shown in the diagram may be also mounted. The substrate 84 is inflected, and the electronic unit 90 and the optical device 50 are bonded with an adhesive agent 92. Alternatively, the optical device 50 and the electronic unit 90 may be mounted on the substrate 84 beforehand, and then the substrate 84 may be inflected so as to bond the optical device 50 with the electronic unit 90.

Figure 12:
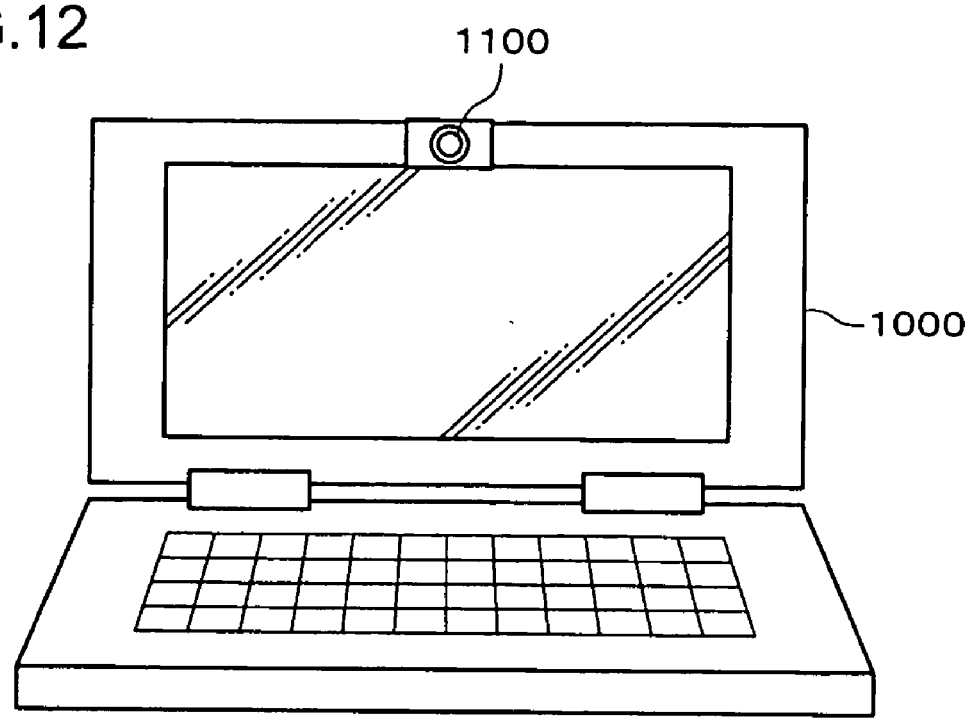
FIG. 12 is a diagram illustrating electronic equipment according to an embodiment of the present invention.
Figure 13:
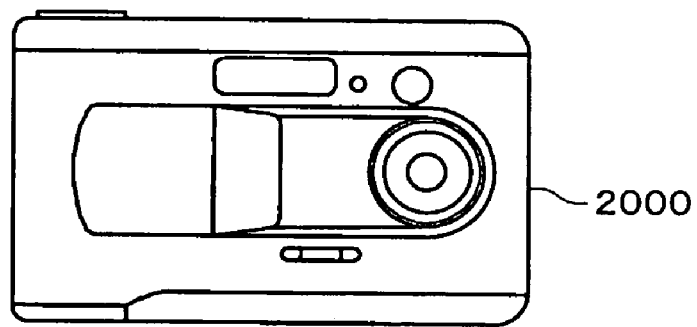
FIG. 13 is a diagram illustrating electronic equipment according to an embodiment of the present invention.
Figure 14:
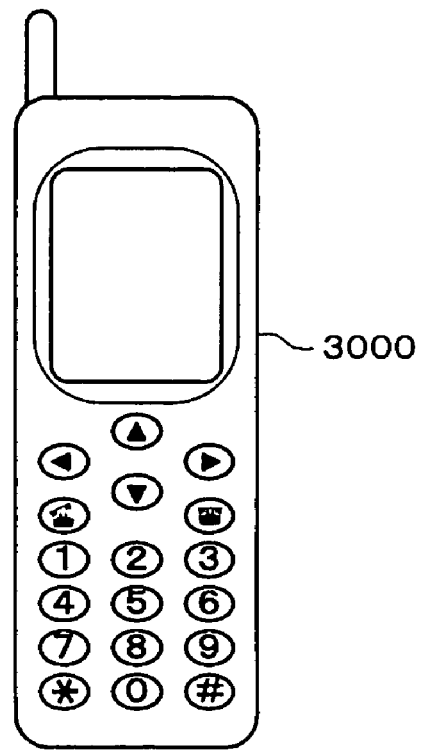
FIGS. 14(A) and (B) are diagrams illustrating electronic equipment according to an embodiment of the present invention.
Figure 14:
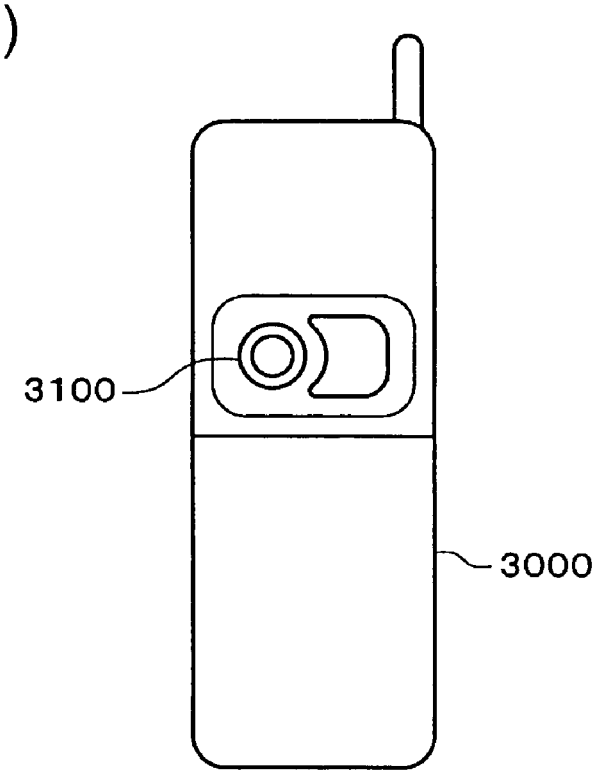

For an example of electronic equipment according to an embodiment of the invention, a notebook computer 1000 (see FIG. 12) includes a camera 1100 having an optical module. For another example, a digital camera 2000 (see FIG. 13) also includes the optical module. Furthermore, a cellular phone 3000 (see FIGS. 14(A) and (B)) includes a camera 3100 also having the optical module.

It should be understood that the invention is not limited to the above embodiments and examples, and is applicable to various modifications. For example, the invention includes various structures that are practically the same as those described in the embodiments above (e.g. structures having the same function, method, and effect, or having the same purpose and effect as those described above). The invention also includes various structures whose nonessential parts used in the embodiments above are replaced. The invention also includes various structures that produce the same effect or that bring the same purpose as those described in the embodiments. Furthermore, the invention includes structures that employ technology in the public domain in addition to the structures described in the embodiments.

What is claimed is:

1. A cover for a semiconductor device having a substrate with an optical unit formed thereon, the cover comprising:
   a portion defining a first opening on a surface of the cover;
   a portion defining a second opening on the surface of the cover;
   a portion defining a third opening on the surface of the cover, wherein the first opening is formed between the second opening and the third opening; and
   a translucent portion in at least the portion defining the second opening, wherein the first opening is formed along a circumference of the second opening, and wherein the first opening contains an adhesive for affixing the cover to the substrate, and wherein the second opening is formed to receive and surround the optical unit inside of the second opening when the cover is affixed to the substrate, and wherein the second opening that includes the optical unit is sealed from the adhesive in the first opening.

2. A cover for a semiconductor device having a substrate with an optical unit formed thereon, the cover comprising:
   a portion defining a first opening on a surface of the cover;
   a portion defining a second opening on the surface of the cover;
   a translucent portion in at least the portion defining the second opening, wherein the first opening is formed alone a circumference of the second opening, and wherein the first opening contains an adhesive for affixing the cover to the substrate, and wherein the second opening is formed to receive and surround the optical unit inside of the second opening when the cover is affixed to the substrate, and wherein the second opening that includes the optical unit is sealed from the adhesive in the first opening; and
   a portion defining a through-hole that extends from a back side of the surface that includes the portion defining the first opening to inside the first opening.

3. The cover for the semiconductor device according to claim 2, further comprising:
   a portion that is formed in line along the cover; and
   a slit that is formed in line on the portion of the first opening that is formed in line.

4. A cover for a semiconductor device having a substrate with an optical unit formed thereon, the cover comprising:
   a portion defining a first opening on a surface of the cover;
   a portion defining a second opening on the surface of the cover; and
   a translucent portion in at least the portion defining the second opening, wherein the first opening is formed alone a circumference of the second opening, and wherein the first opening contains an adhesive for affixing the cover to the substrate, and wherein the second opening is formed to receive and surround the optical unit inside of the second opening when the cover is affixed to the substrate, and wherein the second opening that includes the optical unit is sealed from the adhesive in the first opening;
   wherein the first opening is formed so as to penetrate from one side of the cover to the other side of the cover.

* * * * *